(12) United States Patent
Angell et al.

(10) Patent No.: US 7,273,804 B2
(45) Date of Patent: Sep. 25, 2007

(54) INTERNALLY REINFORCED BOND PADS

(75) Inventors: David Angell, Poughkeepsie, NY (US); Frederic Beaulieu, Granby (CA); Takashi Hisada, Shiga-ken (JP); Adreanne Kelly, Poughkeepsie, NY (US); Samuel Roy McKnight, New Paltz, NY (US); Hiromitsu Miyai, Tokyo (JP); Kevin Shawn Petrarca, Newburgh, NY (US); Wolfgang Sauter, Richmond, VT (US); Richard Paul Volant, New Fairfield, CT (US); Caitlin W. Weinstein, Cambridge, MA (US)

(73) Assignee: International Business Machines Corporation, Armonk, NY (US)

( * ) Notice: Subject to any disclaimer, the term of this patent is extended or adjusted under 35 U.S.C. 154(b) by 340 days.

(21) Appl. No.: 11/030,496

(22) Filed: Jan. 6, 2005

(65) Prior Publication Data

US 2005/0121803 A1  Jun. 9, 2005

(51) Int. Cl.
*H01L 21/44* (2006.01)
*H01L 21/4763* (2006.01)
*H01L 31/00* (2006.01)
*H01L 23/48* (2006.01)

(52) U.S. Cl. ............... 438/612; 438/613; 438/622; 438/623; 438/624; 438/625; 438/626; 438/627; 257/738; 257/758

(58) Field of Classification Search ............ None
See application file for complete search history.

(56) References Cited

U.S. PATENT DOCUMENTS

| | | | | |
|---|---|---|---|---|
| 5,149,674 A | * | 9/1992 | Freeman et al. ............ 438/612 |
| 5,284,797 A | * | 2/1994 | Heim ............... 438/612 |
| 5,349,239 A | * | 9/1994 | Sato ............... 257/737 |
| 5,357,136 A | * | 10/1994 | Yoshioka ............... 257/383 |
| 5,703,408 A | | 12/1997 | Ming-Tsung et al. |
| 5,707,894 A | * | 1/1998 | Hsiao ............... 438/614 |
| 5,736,791 A | * | 4/1998 | Fujiki et al. ............... 257/781 |
| 5,763,936 A | * | 6/1998 | Yamaha et al. ............ 257/644 |
| 5,847,466 A | * | 12/1998 | Ito et al. ............... 257/775 |
| 5,936,283 A | * | 8/1999 | Narita et al. ............... 257/355 |
| 5,962,919 A | * | 10/1999 | Liang et al. ............... 257/748 |
| 6,002,179 A | * | 12/1999 | Chan et al. ............... 257/781 |
| 6,143,396 A | | 11/2000 | Saran et al. |
| 6,191,023 B1 | * | 2/2001 | Chen ............... 438/612 |
| 6,198,170 B1 | | 3/2001 | Zhao |
| 6,222,270 B1 | * | 4/2001 | Lee ............... 257/758 |
| 6,232,662 B1 | | 5/2001 | Suran |

(Continued)

FOREIGN PATENT DOCUMENTS

JP  362299052  * 12/1987

(Continued)

*Primary Examiner*—Carl Whitehead, Jr.
*Assistant Examiner*—James M Mitchell
(74) *Attorney, Agent, or Firm*—Ira D. Blecker

(57) ABSTRACT

Disclosed is a reinforced bond pad structure having nonplanar dielectric structures and a metallic bond layer conformally formed over the nonplanar dielectric structures. The nonplanar dielectric structures are substantially reproduced in the metallic bond layer so as to form nonplanar metallic structures. Surrounding each of the nonplanar metallic structures is a ring of dielectric material which provides a hard stop during probing of the bond pad so as to limit the amount of bond pad that can be removed during probing.

9 Claims, 7 Drawing Sheets

U.S. PATENT DOCUMENTS

| | | | |
|---|---|---|---|
| 6,255,586 B1 * | 7/2001 | Kim et al. | 174/538 |
| 6,306,750 B1 | 10/2001 | Huang et al. | |
| 6,400,021 B1 | 6/2002 | Cho | |
| 6,448,641 B2 * | 9/2002 | Ker et al. | 257/700 |
| 6,448,650 B1 | 9/2002 | Saran et al. | |
| 6,472,763 B2 * | 10/2002 | Fukuda et al. | 257/780 |
| 6,563,216 B1 | 5/2003 | Kimura et al. | |
| 2001/0000928 A1 * | 5/2001 | Lee et al. | 257/786 |
| 2001/0051426 A1 | 12/2001 | Pozder et al. | |
| 2002/0068385 A1 | 6/2002 | Ma et al. | |
| 2002/0179991 A1 * | 12/2002 | Varrot et al. | 257/459 |
| 2003/0047794 A1 * | 3/2003 | Watanabe | 257/503 |
| 2003/0139030 A1 * | 7/2003 | Grigg | 438/613 |
| 2003/0222353 A1 * | 12/2003 | Yamada | 257/774 |
| 2004/0004284 A1 | 1/2004 | Lee et al. | |

FOREIGN PATENT DOCUMENTS

JP    403096236    4/1991

* cited by examiner

INTERNALLY REINFORCED BOND PADS

RELATED APPLICATION

This application is related to U.S. patent application Ser. No. 10/249,382 entitled Wedgebond Pads Having a Nonplanar Surface Structure, filed even date herewith and incorporated by reference herein.

BACKGROUND OF THE INVENTION

The present invention relates generally to integrated circuits and, more particularly, relates to integrated circuits having a mechanically robust bond pad.

Integrated circuits are formed on semiconductor substrates using a number of different processing operations that create the circuit elements. In order to access circuitry associated with the semiconductor substrate, bond pads are formed on the integrated circuits. Bond pads provide the means for transfer of electrical signals and power from and to the semiconductor substrate via probes, bonding wires, conductive bumps, etc.

Bond pads are typically formed of aluminum because aluminum is self-passivating and, therefore, more resistant to degradation from atmospheric pressure. Aluminum, and more recently, copper are used for the metal layers within the integrated circuit. Copper is more preferred because of its improved electromigration performance and ability to support higher current density as compared to aluminum.

In order to realize the advantages of the self-passivating character of aluminum and the superior electrical characteristics of copper, composite bond pad structures can be used in integrated circuit designs. In composite bond pad structures, copper is used for the underlying layer of the pad that interfaces with other layers in the integrated circuit. A corrosion-resistant aluminum capping layer is formed on top of the copper portion that creates an hermetic seal that protects the copper portion from atmospheric exposure. In order to physically separate the copper and aluminum portions of the composite bond pad while allowing for electrical connectivity, a relatively thin barrier metal layer may be formed at the interface.

Problems can arise in composite bond pad structures when test and probe operations are performed. To achieve good electrical continuity with the bond pad, elements such as probes must exert forces that can damage or displace portions of the bond pad surface. In addition, if the probe exposes the underlying copper to the ambient, degradation of the copper can occur.

Another problem that can arise with bond pad structures concerns the physical force exerted on the bond pad by a probe that can propagate to lower layers based on the physical couplings within the integrated circuit. Low Young's modulus dielectrics underlying the bond pad may not be able to support such stress resulting from the force propagation.

Various solutions have been proposed for improving bond pad integrity.

Pozder et al. U.S. Patent Application Publication US 2001/0051426, the disclosure of which is incorporated by reference herein, discloses in FIG. 2 a composite bond pad comprising copper (but alternatively could comprise aluminum), dielectric support structures and then a final layer of aluminum. The dielectric support structures can have different configurations as shown in FIG. 5 of the reference. These support structures provide mechanical shielding of the interface formed between the aluminum layer and the underlying copper layer.

Ma et al. U.S. Patent Application Publication US 2002/0068385, the disclosure of which is incorporated by reference herein, discloses an anchored bond pad in which a bond pad is formed on a dielectric layer wherein the dielectric layer has via openings which are filled with metal. The metal-filled via openings secure the bond pad to the dielectric layer.

Ming-Tsung et al. U.S. Pat. No. 5,703,408, the disclosure of which is incorporated by reference herein, discloses a bond pad structure in which stripes are formed in a sublayer which induce an irregular surface of the top metallic bond pad. An object of this particular arrangement is to increase the adhesion of the various layers that make up the bonding pad. Similarly, Mukogawa Japanese Published Patent Application JP 3-96236, the disclosure of which is incorporated by reference herein, discloses an irregular sublayer which induces an irregular surface of the top layer.

Saran et al. U.S. Pat. No. 6,143,396, Saran U.S. Pat. No. 6,232,662, Zhao U.S. Pat. No. 6,198,170, and Saran et al. U.S. Pat. No. 6,448,650, the disclosures of which are incorporated by reference herein, all disclose various reinforcing schemes under the bonding pad. Thus, in Saran et al. U.S. Pat. No. 6,143,396, a metal bond pad is supported by a layer of dielectric and a reinforcing structure. In Saran U.S. Pat. No. 6,232,662, a metal bond layer is supported by an interlevel dielectric layer and a reinforcing layer comprising metal and reinforcing dummy structures. In Zhao U.S. Pat. No. 6,198,170, a bonding pad is supported by a large via and several layers of alternating segments of metal and dielectric. Lastly, in Saran et al. U.S. Pat. No. 6,448,650, a metal bonding pad is supported by a first dielectric, then an interlevel dielectric and finally by a reinforcing layer comprising alternating dielectric and metal.

A need exists for an improved bond pad that can survive forces applied by probing and packaging and which will protect the underlying metal layer, preferably which is copper.

Accordingly, it is an object of the present invention to have an improved bond pad which is mechanically robust to survive the forces of probing and packaging.

It is another object of the present invention to have an improved bond pad which can survive probing and packaging and which can also protect the underlying metal layer.

These and other objects of the present invention will become more apparent after referring to the following description of the invention considered in conjunction with the accompanying drawings.

BRIEF SUMMARY OF THE INVENTION

The objects of the invention have been achieved by providing, according to a first aspect of the invention, a reinforced bond pad structure comprising:
 a substrate;
 a metallic layer formed on the substrate;
 a dielectric layer over the metallic layer, at least one through via to the metallic layer and at least a portion of the dielectric layer comprising a plurality of nonplanar dielectric structures;
 a metallic bond layer conformally formed over the nonplanar structures of the dielectric layer such that the nonplanar dielectric structures are substantially reproduced in the metallic bond layer as nonplanar metallic structures, the metallic bond layer further formed in the through via so as to contact the metallic layer; and a ring of dielectric material surrounding each of the nonplanar metallic structures.

According to a second aspect of the invention, there is provided a method of forming internally reinforced bond pads, the method comprising the steps of:

forming a metallic layer on a substrate;

forming a first dielectric layer over the metallic layer;

patterning a first portion of the first dielectric layer so as to form at least one through via to the metallic layer and a plurality of nonplanar dielectric structures, a second portion of the first dielectric layer being unpatterned;

conformally depositing a metallic bond layer over the nonplanar dielectric structures and into the through via such that the nonplanar dielectric structures are substantially reproduced in the metallic bond layer as nonplanar metallic structures;

forming a second dielectric layer over the nonplanar metallic structures and the unpatterned portion of the first dielectric layer; and removing substantially all of the second dielectric layer over the nonplanar metallic structures except for a ring of dielectric material surrounding each of the nonplanar metallic structures.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
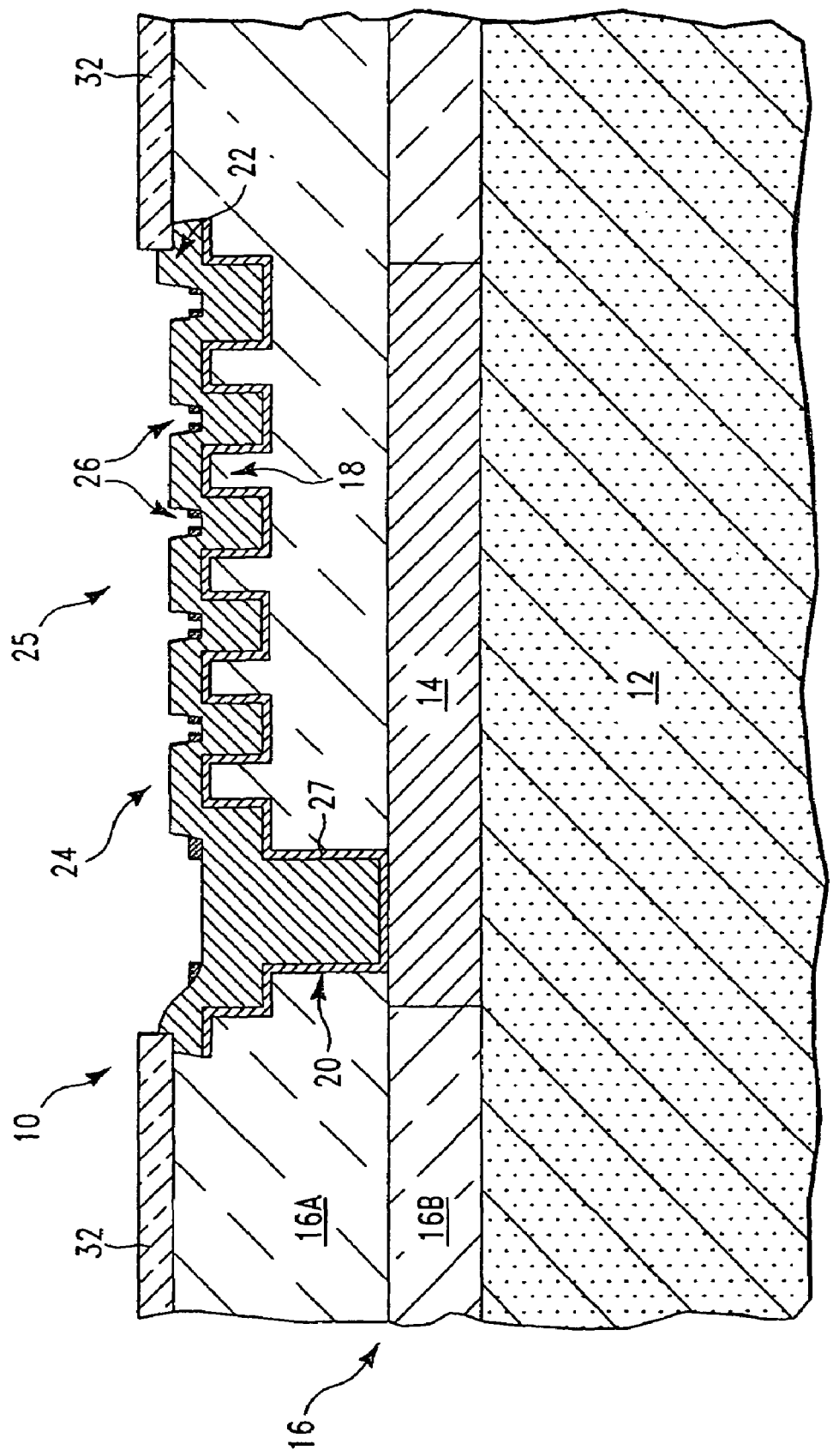
FIG. 1 is a cross sectional view of a semiconductor device having an internally reinforced bonding pad.

Referring to the Figures in more detail, and particularly referring to FIG. 1, there is shown a cross sectional view of a semiconductor device 10 having a reinforced bond pad structure 25. The semiconductor device 10 includes a substrate 12 which may be semiconductor material such as silicon, silicon germanium, and the like, or more typically, is a previous wiring level already fabricated on the semiconductor material. For the sake of clarity, details of any previous wiring levels are not shown. Also included in semiconductor device 10 is metallic layer 14 formed on substrate 12 and dielectric layer 16 formed on metallic layer 14 as well as substrate 12. Dielectric layer 16 may be comprised of two separately formed dielectric layers 16A, 16B, if desired. The metallic material may be aluminum or copper but preferably is copper. The nominal thickness of the metallic layer is usually 0.4 to 1.2 microns. The dielectric layer 16 is then patterned to form at least one through via 20 and a plurality of nonplanar dielectric structures 18. The thickness of the dielectric layer 16 is nominally 0.5 to 10 microns.

A metallic bond layer 22, preferably aluminum, is then conformally formed over the nonplanar dielectric structures 18. The thickness of the metallic bond layer 22 above the nonplanar dielectric structures 18 should be about 0.4 to 1.5 microns, preferably 1.2 microns. Since the metallic bond layer 22 is conformally formed, the nonplanar dielectric structures 18 will be substantially reproduced in the metallic bond layer 22 to form nonplanar metallic structures 24. By "substantially reproduced" is meant that the general shape is reproduced but not exactly. That is, where the sides of the nonplanar dielectric structures 18 may be vertical, the sides of the nonplanar metallic structures 24 may be sloped. Also, where the corners of the nonplanar dielectric structures 18 may be sharp, the corners of the nonplanar metallic structures 24 may be rounded. The metallic bond layer 22 also fills through via 20 to make electrical contact with metallic layer 14.

Figure 6:
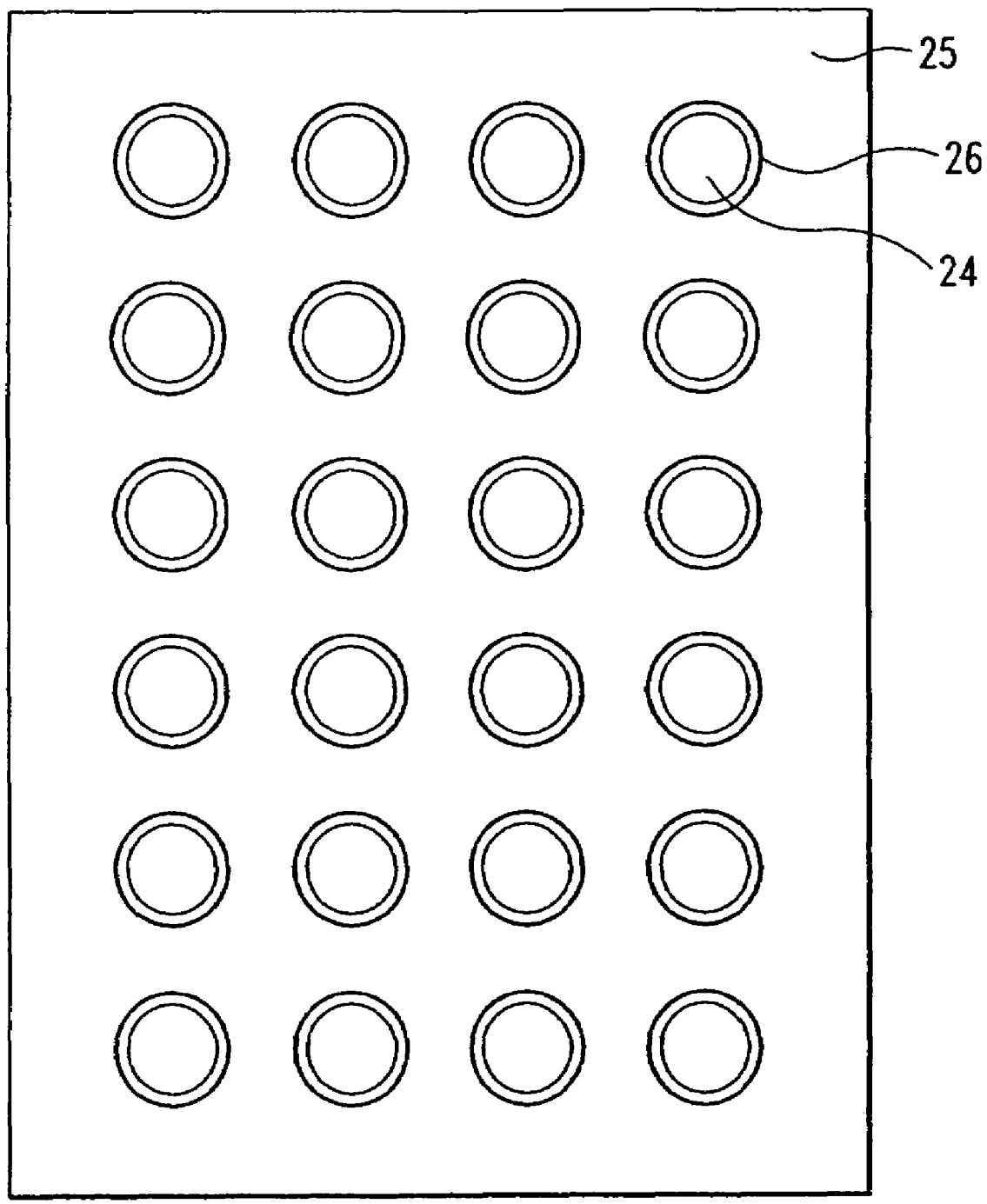
FIG. 6 is a top view of the internally reinforced bonding pad.

Lastly, the completed reinforced bond pad structure 25 includes a ring of dielectric material 26 around the nonplanar metallic structures 24. It has been found that this ring of dielectric material 26, in addition to the nonplanar dielectric structures 18, is beneficial during probing of the bond pad. The ring of dielectric material 26 may be any dielectric material such as silicon nitride ($SiN_x$) or silicon oxide ($SiO_2$) and in a thickness of about 0.1 to 0.2 microns. A top view of the bond pad structure 25 with the nonplanar metallic structures 24 and rings of dielectric material 26 is illustrated in FIG. 6.

Figure 7:
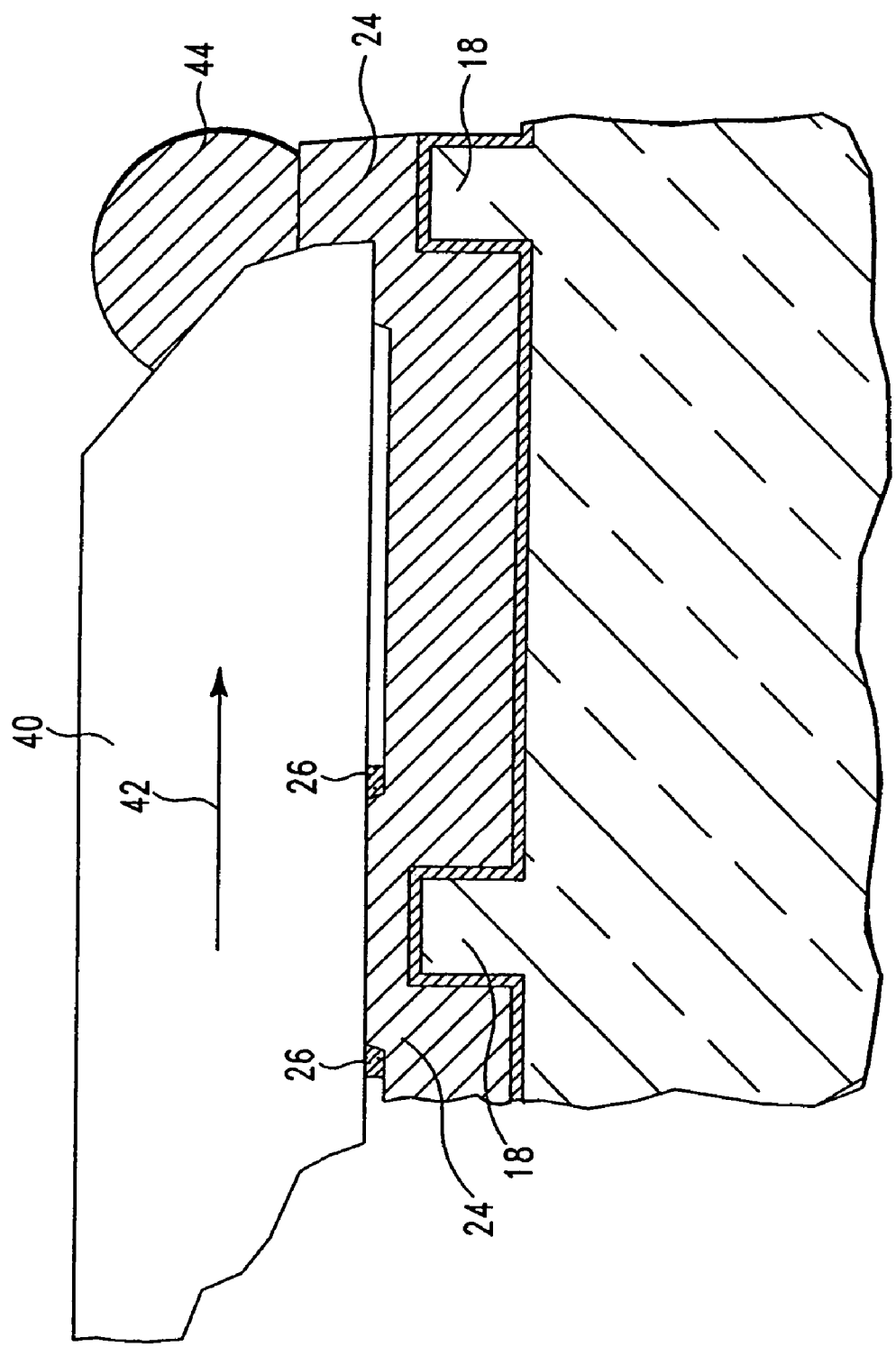
FIG. 7 is an enlarged partial cross sectional view of an internally reinforced bonding pad being probed.

The underlying nonplanar dielectric structures 18 provide mechanical support to the bond pad structure 25 during probing. In addition, as frequently happens, the overlying metallic bond layer 22 may be scraped off during probing but the nonplanar dielectric structures 18 and ring of dielectric material 26 prevent the probe from removing all of the metallic bond layer 22. The nonplanar dielectric structures 18 and ring of dielectric material 26 cooperate to provide a hard stop to the probe. Referring to FIG. 7, probe 40 moving in the direction indicated by arrow 42 has removed a portion of nonplanar metallic structure 24. The cumulative total of the removed portions of nonplanar metallic structures 24 is indicated by ball 44. As can be seen from FIG. 7, the ring of dielectric material 26 provides a hard stop beyond which the probe 40 can not remove any further metallic material of nonplanar metallic structure 24.

The nonplanar dielectric structures 18, and hence also nonplanar metallic structures 24, can take any form such as columns or stripes. Viewed from the top, the nonplanar metallic structures 24 can be circles (as shown in FIG. 6), rectangles or polygons. No matter their shape, they should be spaced closer together than the diameter (or other cross sectional dimension) of the probe so that the probe cannot penetrate in between the nonplanar dielectric structures 18 to adversely affect the remaining metallic bond layer 22. For example, for an 18 micron probe tip, the nominal spacing of the nonplanar dielectric structures 18 should be a maximum of about 17 microns. Further, it is preferable that the nonplanar dielectric structures 18 should be made as small as possible, on the order of 0.5 to 1 microns in width. The size of the nonplanar dielectric structures 18 is limited only by lithography and etch capabilities. Moreover, it is best to have the nonplanar dielectric structures 18 spaced as far apart as possible so long as they are less than the probe dimension.

If metallic layer 14 is copper and metallic bond layer 22 is aluminum, it would be desirable to have a barrier layer 27 at the bottom of through via 20. Such a barrier layer 27 could comprise, for example, Ta/TaN, TaN, Ti/TiN, W or a combination thereof. As a practical matter, the barrier layer 27 would be present throughout the bond pad structure 25 as shown in the Figures.

Figure 2:
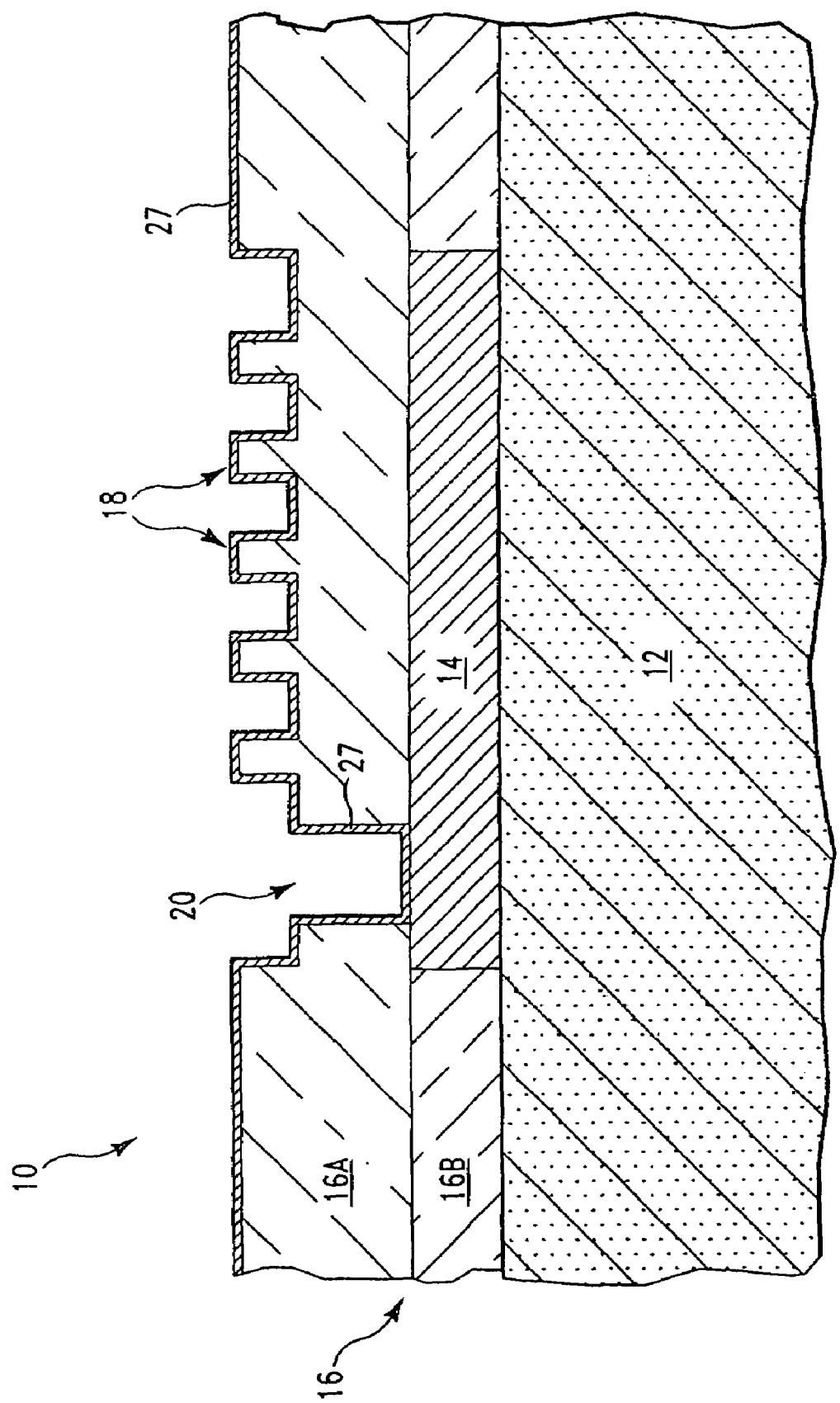
FIGS. 2 to 5 illustrate a preferred process for forming the semiconductor device of FIG. 1.

Referring now to FIGS. 2 through 5, the method for forming the reinforced bond pad structure 25 of FIG. 1 will be discussed. Referring first to FIG. 2, metallic layer 14 (the last internal wiring level) is conventionally formed on substrate 12. Thereafter, dielectric layer 16 (or separate dielectric layers 16A, 16B) is conventionally formed on substrate 12 and metallic layer 14. Dielectric layer 16 is patterned by conventional means to form through via 20 and nonplanar dielectric structures 18. As noted previously, if metallic layer 14 is copper and the metal to be subsequently deposited in through via 20 is aluminum, then it may be desirable to deposit barrier layer 27 at the bottom of through via 20.

Figure 3:
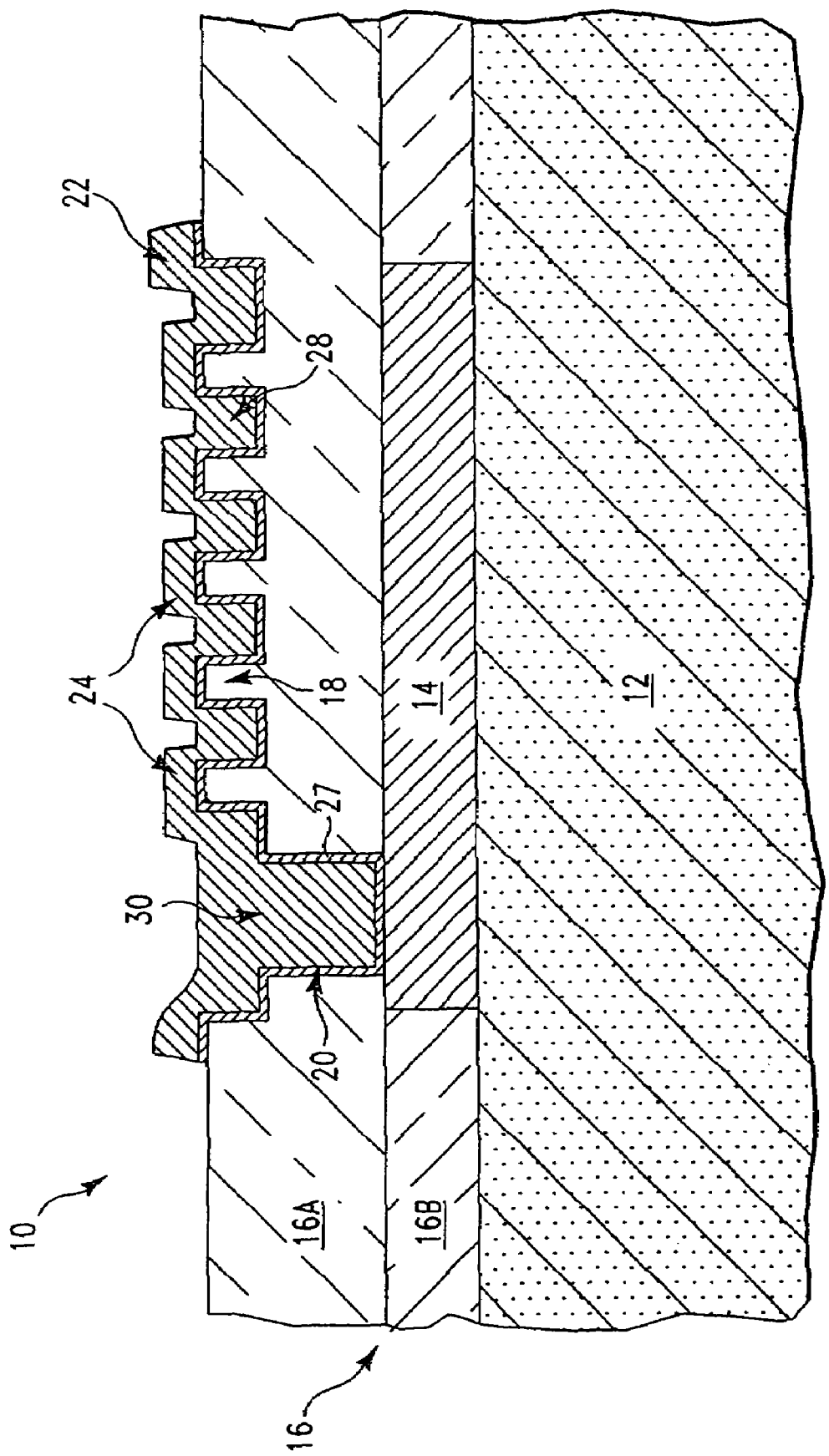

Thereafter, as shown in FIG. 3, a blanket layer of metallic material is deposited over dielectric layer 16 and then patterned to result in the structure shown in FIG. 3. The metallic bond layer 22 fills the through via 20 with metallic material 30 and fills the spaces between nonplanar dielectric structures 18 with metallic material 28. Also formed at this time are nonplanar metallic structures 24 which substantially correspond in shape to nonplanar dielectric structures 18. The method of depositing metallic bond layer 22 is unimportant to the present invention. Generally speaking, the thickness of the metallic bond layer 22 should be greater than the height of the nonplanar dielectric structures 18. As an example, if the height of the nonplanar dielectric structures 18 are 0.85 microns, the thickness of the metallic bond layer 22 could be 1.2 microns.

Figure 4:
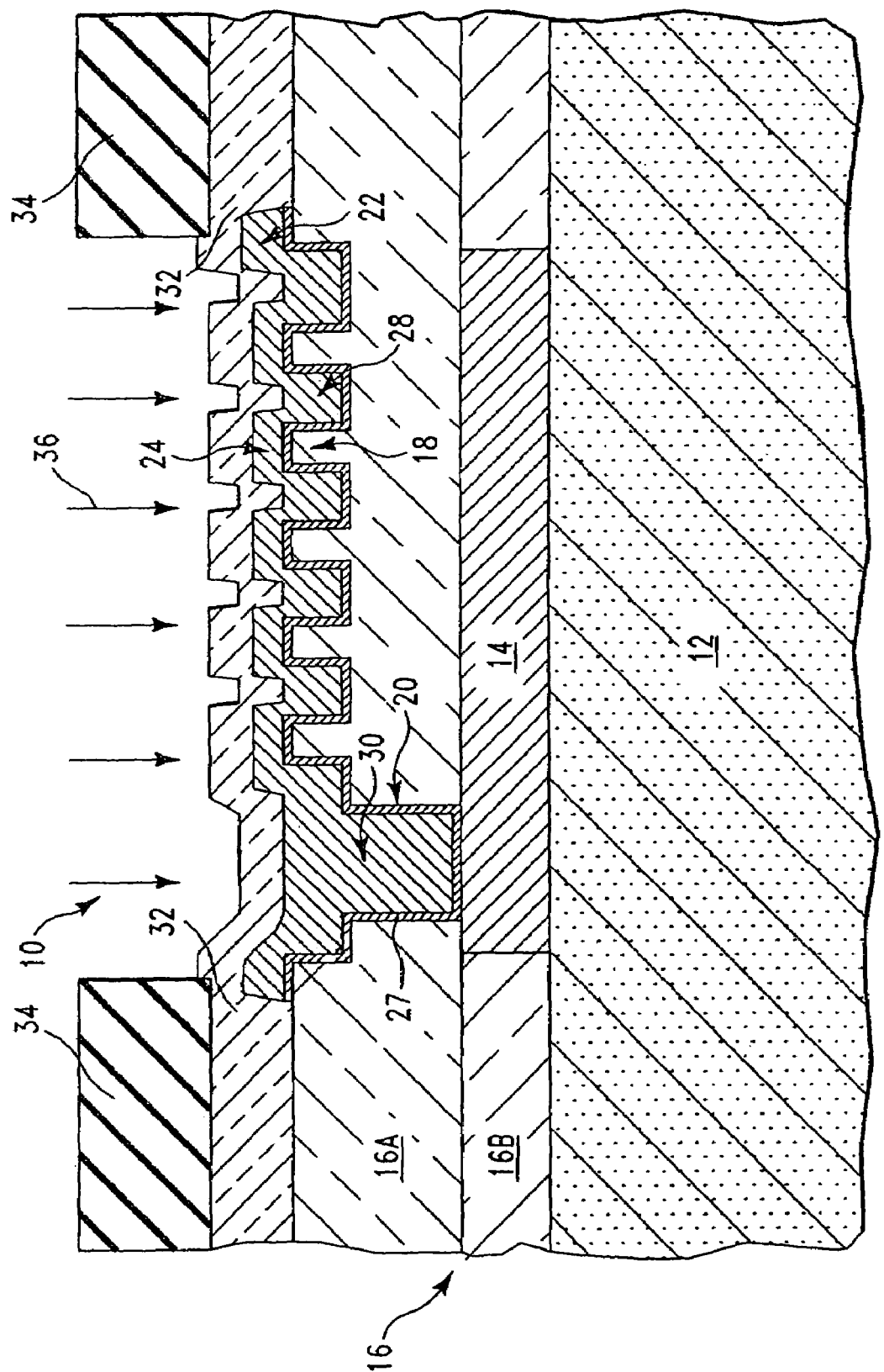
Figure 5:
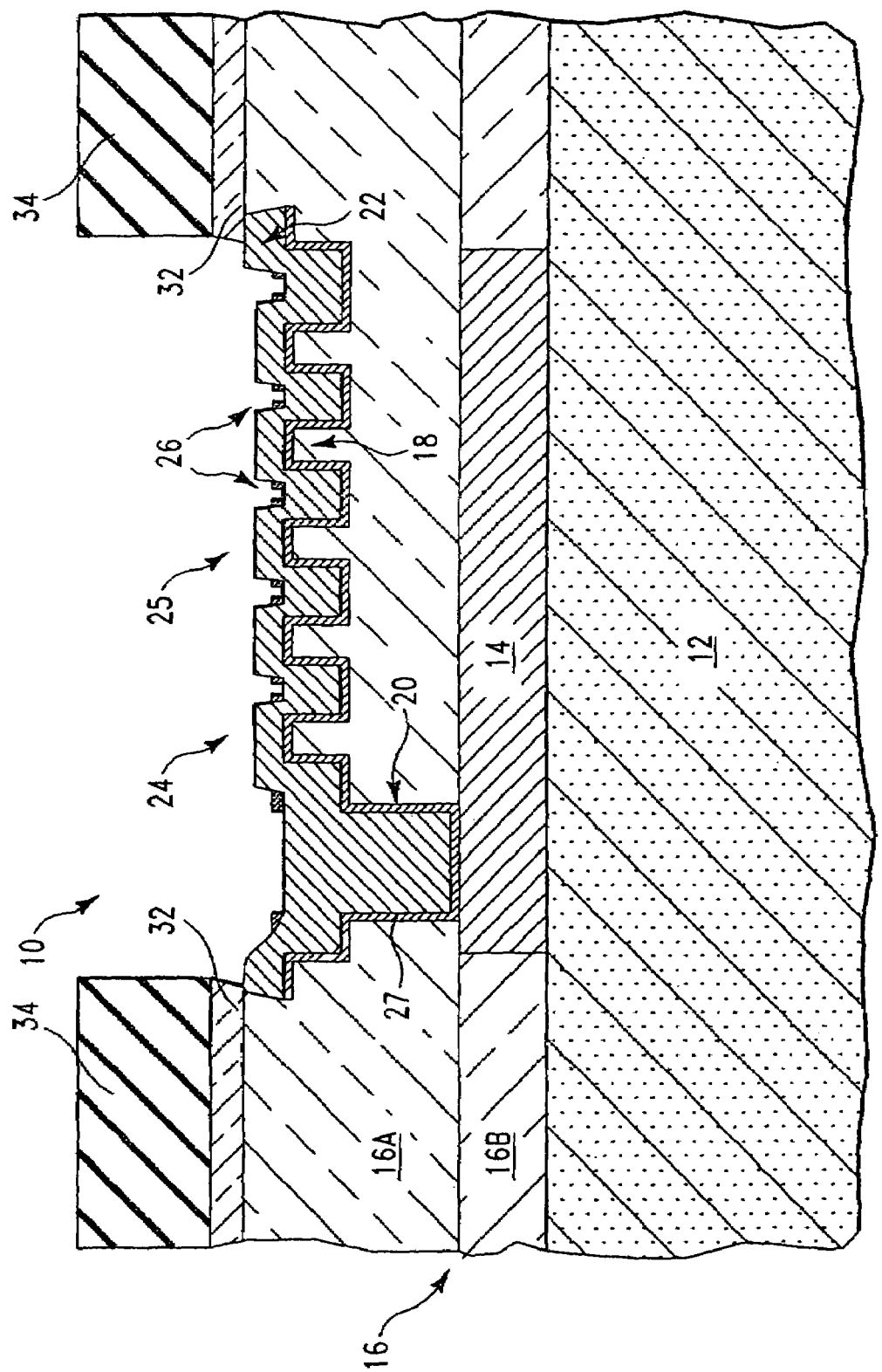

Referring now to FIG. 4, dielectric layer 32 is conventionally blanket deposited over dielectric layer 16 and metallic bond layer 22. Portions of dielectric layer 32 are masked 34 and then the unmasked portions of the dielectric layer 32 are subjected to a dry etchant such as reactive ion etching (RIE), indicated by arrows 36, to substantially remove all of dielectric layer 32 over metallic layer 22. After RIE (or other suitable etching step), there is only a small portion of the dielectric layer 32 left surrounding the nonplanar metallic structures 24. These remaining small portions of the dielectric layer 32 are the ring of dielectric material 26 that surrounds each of the nonplanar metallic structures 26 as shown in FIG. 5.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming internally reinforced bond pads, the method comprising the steps of:
    forming a metallic layer on a substrate;
    forming a first dielectric layer over the metallic layer;
    patterning a first portion of the first dielectric layer so as to form at least one through via to the metallic layer and a plurality of spaced-apart dielectric structures, a second portion of the first dielectric layer being unpatterned;
    conformally depositing a metallic bond layer over the spaced-apart dielectric structures and into the through via such that the spaced-apart dielectric structures are substantially reproduced in the metallic bond layer as spaced-apart metallic structures;
    forming a second dielectric layer over the spaced-apart metallic structures and the unpatterned portion of the first dielectric layer; and
    removing substantially all of the second dielectric layer over the spaced-apart metallic structures except for a plurality of separated discrete rings of dielectric material wherein each ring surrounds a spaced-apart metallic structure.

2. The method of claim 1 wherein the spaced-apart metallic structures comprise columns or stripes.

3. The method of claim 1 wherein the spaced-apart dielectric structures have vertical sides.

4. The method of claim 1 wherein there is a barrier layer between the metallic layer and the metallic bond layer.

5. The method of claim 1 wherein the ring of dielectric material comprises silicon nitride or silicon oxide.

6. The method of claim 1 wherein each of the spaced-apart metallic structures comprises a base portion and a top portion and each ring of dielectric material surrounds only the base portion of each of the spaced-apart metallic structures.

7. The method of claim 1 wherein in the step of removing, the ring of dielectric material is surrounding and in contact with each of the spaced-apart metallic structures.

8. A method of forming internally reinforced bond pads, the method comprising the steps of:
    forming a metallic layer on a substrate;
    forming a first dielectric layer over the metallic layer;
    patterning a first portion of the first dielectric layer so as to form at least one through via to the metallic layer and a plurality of spaced-apart dielectric structures, a second portion of the first dielectric layer being unpatterned;
    conformally depositing a metallic bond layer over the spaced-apart dielectric structures and into the through via such that the spaced-apart dielectric structures are substantially reproduced in the metallic bond layer as spaced-apart metallic structures;
    forming a second dielectric layer over the spaced-apart metallic structures and the unpatterned portion of the first dielectric layer; and
    removing substantially all of the second dielectric layer from the spaced-apart metallic structures so as to expose the spaced-apart metallic structures except for a plurality of separated discrete rings of dielectric material in wherein each ring surrounds a spaced-apart metallic structure.

9. The method of claim 8 wherein in the step of removing, the ring of dielectric material is surrounding and in contact with each of the spaced-apart metallic structures.

* * * * *